United States Patent
Shinjo et al.

[11] Patent Number: 6,072,311
[45] Date of Patent: Jun. 6, 2000

[54] MAGNETIC SENSOR WITH SIMPLIFIED INTEGRAL CONSTRUCTION

[75] Inventors: Izuru Shinjo; Yasuyoshi Hatazawa, both of Tokyo, Japan

[73] Assignee: Mitsubishi Denki Kabushiki Kaisha, Tokyo, Japan

[21] Appl. No.: 08/936,916

[22] Filed: Sep. 25, 1997

[30] Foreign Application Priority Data

Mar. 26, 1997 [JP] Japan ..................... 9-074056

[51] Int. Cl.⁷ ..................... G01P 3/488; G01R 33/09; H01L 43/08
[52] U.S. Cl. ..................... 324/174; 257/427; 324/252
[58] Field of Search ..................... 324/173, 174, 324/207.12, 207.2, 207.21, 207.22, 207.25, 251, 252; 338/32 R, 32 H; 257/421, 427

[56] References Cited

U.S. PATENT DOCUMENTS

| | | | |
|---|---|---|---|
| 4,687,994 | 8/1987 | Fulkerson et al. | 324/251 |
| 4,705,964 | 11/1987 | Higgs | 324/251 X |
| 4,853,632 | 8/1989 | Nagano et al. | 324/207.22 X |
| 4,982,155 | 1/1991 | Ramsden | 324/207.2 |
| 5,084,674 | 1/1992 | Lachmann et al. | 324/174 |
| 5,173,758 | 12/1992 | Heremans | 324/207.21 |
| 5,414,355 | 5/1995 | Davidson et al. | 324/207.2 |
| 5,561,368 | 10/1996 | Dovek et al. . | |
| 5,585,775 | 12/1996 | Ishishita | 324/207.21 X |
| 5,619,137 | 4/1997 | Vig et al. | 324/207.12 X |
| 5,631,556 | 5/1997 | Shibata . | |
| 5,670,886 | 9/1997 | Wolff et al. | 324/207.21 X |
| 5,729,132 | 3/1998 | Otaki | 324/207.21 |
| 5,744,950 | 4/1998 | Sefeldt | 324/207.21 X |

FOREIGN PATENT DOCUMENTS

| | | |
|---|---|---|
| 36 09 006 A1 | 9/1987 | Germany . |
| 44 06 351 A1 | 8/1995 | Germany . |
| 195 23 322 A1 | 1/1997 | Germany . |

*Primary Examiner*—Gerard Strecker
*Attorney, Agent, or Firm*—Sughrue, Mion, Zinn, Macpeak & Seas, PLLC

[57] ABSTRACT

A magnetic sensor which can be produced in a small size at low cost with high productivity. The magnetic sensor includes: a main electric circuit; a magnet disposed on said main electric circuit; and a detector unit including an integrated circuit having a magnetic detector unit composed of a sensing resistor for outputting a signal in the form of a voltage change corresponding to the change in the magnetic field of the magnet, and having a filter for removing noise from a signal applied to a processing circuit of the integrated circuit.

12 Claims, 11 Drawing Sheets

MAGNETIC SENSOR WITH SIMPLIFIED INTEGRAL CONSTRUCTION

BACKGROUND OF THE INVENTION

1. Field of the Invention

The present invention relates to a magnetic sensor, for example, for detecting the speed of revolution of a gear-shaped magnetic rotor.

2. Description of the Related Art

FIG. 17 is a side view of a conventional magnetic sensor. FIG. 18 is a sectional side view of the magnetic sensor shown in FIG. 17. FIG. 19 is a bottom view illustrating the inner structure of the magnetic sensor shown in FIG. 18 wherein its case is removed so that the inner structure can be seen. The magnetic sensor includes: a main part 1 of the sensor, and a connector 2 connected to the main part 1 of the sensor.

The main part 1 of the sensor includes: a cylindrical case 3 made up of a synthetic resin; a main electric circuit 4 placed in the case 3; a rectangular-shaped permanent magnet 5 disposed at an end of the main electric circuit 4; and a detector unit 6 including a giant magnetoresistive element (hereinafter referred to as a GMR) serving as a magnetic field sensing element wherein the detector unit 6 is disposed in front of the permanent magnet 5.

The main electric circuit 4 includes: a base 8 made of a synthetic resin; a resistor 9 and a capacitor 10 disposed on the base 8; and interconnecting conductors 11 for making electrical connections among the resistor 9, the capacitor 10, and the detector unit 6.

In the above magnetic sensor, when a gear-shaped magnetic rotor 12 disposed near the magnetic sensor is rotated, the recessed portions 12a and the protruding portions 12b of the magnetic rotor 12 alternately approach and pass by the detector unit 6. This creates a corresponding change in the magnetic field of the permanent magnet 5 which is applied to the detector unit 6. The above change in the magnetic field is detected as a change in voltage by the GMR element in the detector unit 6. The change in voltage generated by the GMR element is converted to an electric signal in the form of a pulse via a differential amplifier and a comparator in the detector unit 6. The resultant electric signal in pulse form is output to the outside. The electric signal is transmitted to a computer unit (not shown) via a terminal of the connector 2 so as to detect the rotation angle of the magnetic rotor 12. A filter is formed with the resistor 9 and the capacitor 10, wherein the filter serves to prevent the detector unit 6 from being exposed to external noise such as an external surge.

In the conventional magnetic sensor described above, the resistor 9 and the capacitor 10 are firmly fixed to the base 8 by soldering. However, a long processing time is required to fix these elements. This causes a reduction in the production efficiency of the magnetic sensor, and thus causes an increase in production cost. Furthermore, the resistor 9 and the capacitor 10 occupy a rather large area of the base 8. This causes an increase in the total size of the magnetic sensor.

Thus, it is a general object of the present invention to solve the above problems. More specifically, it is an object of the present invention to provide a magnetic sensor which can be produced in a small size at low cost with high productivity.

SUMMARY OF THE INVENTION

According to an aspect of the present invention, there is provided a magnetic sensor including an integrated circuit having a filter for removing noise from a signal which is generated by a magnetic detector unit and applied to a processing circuit.

Preferably, the filter is constructed using a capacitor.

The filter may also be constructed using a capacitor and a resistor connected to the capacitor.

Preferably, the above resistor is formed in the same structure as the magnetic field sensing element of the magnetic detector unit.

The resistor may be formed in a zigzag shape having curved portions, a part of the curved portions being formed with a conductive layer for improving the surge resistance of the curved portions.

The curved portions of the zigzag resistor may also be formed with a conductive layer.

Preferably, the above conductive layer is formed in the same structure as the the interconnecting conductor which connects the resistor to the processing circuit.

The electrode of the above capacitor may be formed in the same structure as the interconnecting conductor which connects the capacitor to the processing circuit.

DESCRIPTION OF THE PREFERRED EMBODIMENTS

First Embodiment

Figure 1:
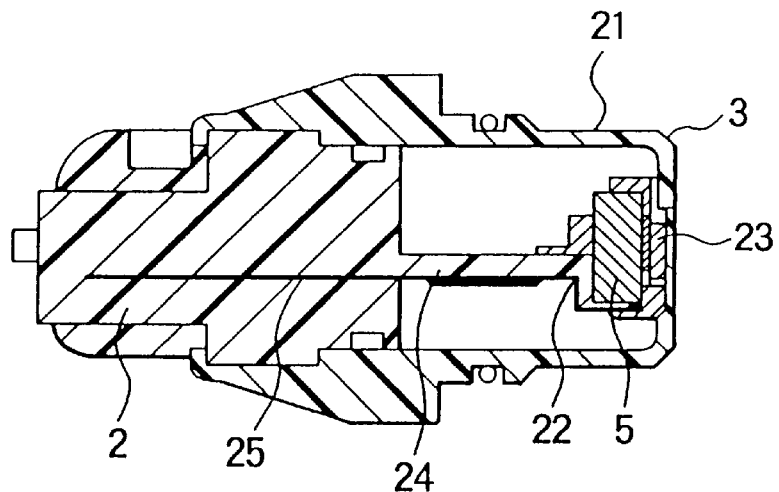
FIG. 1 is a sectional side view of a magnetic sensor according to a first embodiment of the invention.
Figure 2:
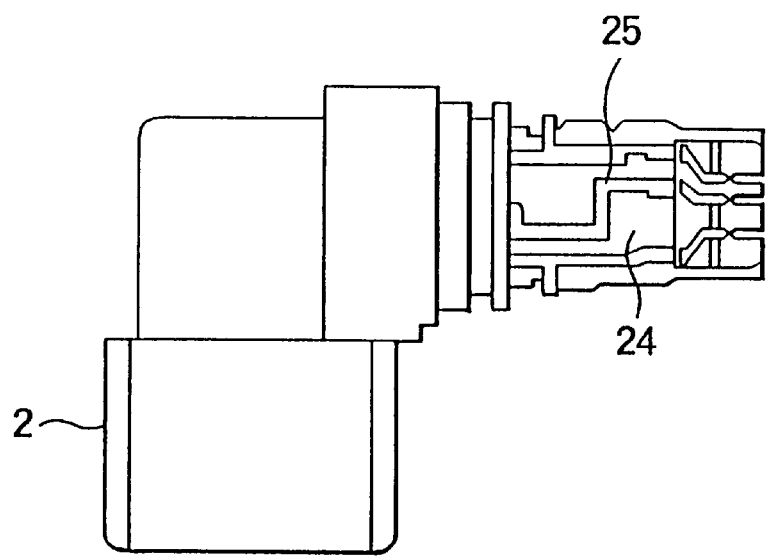
FIG. 2 is a bottom view illustrating the inner structure of the magnetic sensor shown in FIG. 1, wherein its case is removed so that the inner structure can be seen.

FIG. 1 is a sectional side view of a magnetic sensor according to a first embodiment of the invention. FIG. 2 is a bottom view illustrating the inner structure of the magnetic sensor shown in FIG. 1 wherein its case is removed so that the inner structure can be seen. This magnetic sensor includes: a main part 21 of the sensor, and a connector 2 connected to the main part 21.

The main part 21 of the sensor includes: a cylindrical case 3 made of a synthetic resin; a main electric circuit 22 placed in the case 3; a rectangular-shaped permanent magnet 5 disposed at an end of the main electric circuit 22; and a detector unit 23 including a giant magnetoresistive element (hereinafter referred to as a GMR) serving as a magnetic field sensing element wherein the detector unit 23 is disposed in front of the permanent magnet 5.

The main electric circuit 22 includes: a base 24 made of a synthetic resin; and an interconnecting conductor 25 formed on the base to make an electric connection between the detector unit 23 and the terminal (not shown) of the connector 2.

Figure 3:
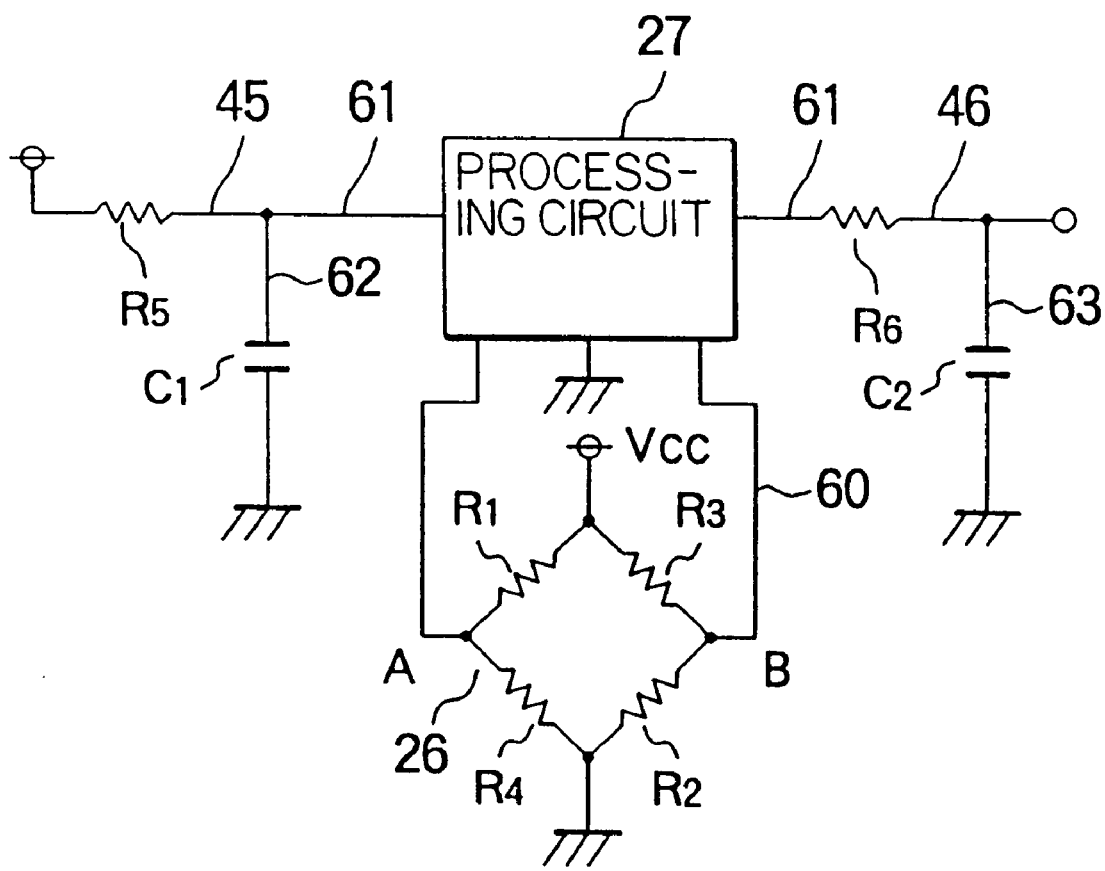
FIG. 3 is a circuit diagram illustrating the detector unit shown in FIG. 1.
Figure 4:
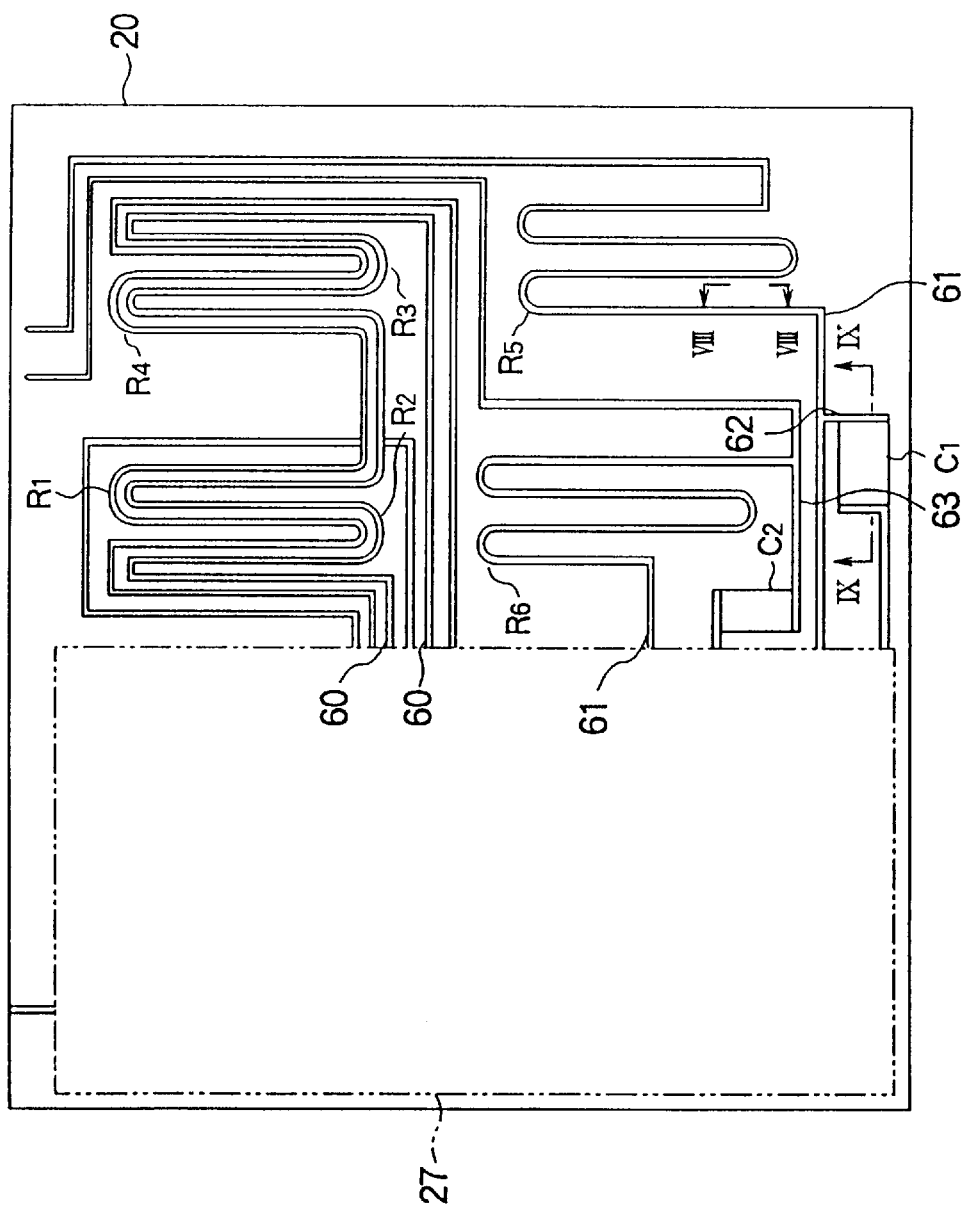
FIG. 4 is a plan view of an integrated circuit disposed in the detector unit shown in FIG. 1.
Figure 5A:
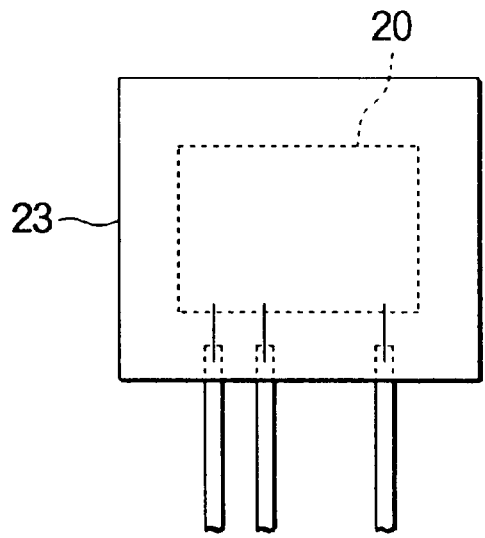
FIG. 5(a) is a front view of the detector unit shown in FIG. 1.
Figure 5B:
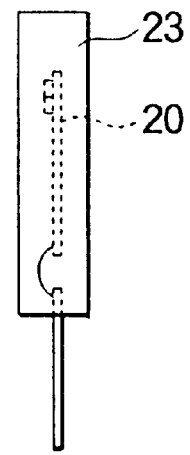
FIG. 5(b) is a side view of FIG. 5(a)

FIG. 3 is a circuit diagram illustrating the detector unit 23. FIG. 4 is a plan view of an integrated circuit 20 disposed in the detector unit 23 (wherein a protective film is removed). FIG. 5(a) is a front view of the detector unit 23, and FIG. 5(b) is a side view of FIG. 5(a).

The magnetic detector unit 26 includes a bridge circuit composed of sensing resistors $R_1$, $R_2$, $R_3$, and $R_4$, each realized using a GMR element. The magnetic detector unit 26 is connected via a first interconnecting conductor 60 to a processing circuit 27 including a differential amplifier and a comparator. The processing circuit 27 is electrically connected via a second interconnecting conductor 61 to a power supply resistor $R_5$ on the power supply side and an output resistor $R_6$ on the output side, both formed using a GMR element. The power supply resistor $R_5$ is also connected to a surge protection capacitor $C_1$ via a third interconnecting conductor 62. The output resistor $R_6$ is also connected to an output capacitor $C_2$ via a fourth interconnecting conductor 63. The power supply resistor $R_5$ and the surge protection capacitor $C_1$ constitute a first filter 45. The output resistor $R_6$ and the output capacitor $C_2$ constitute a second filter 46. The above filters, which serve as filters for protecting the processing circuit 27 from noise, may also be formed using only capacitors.

Figure 6:
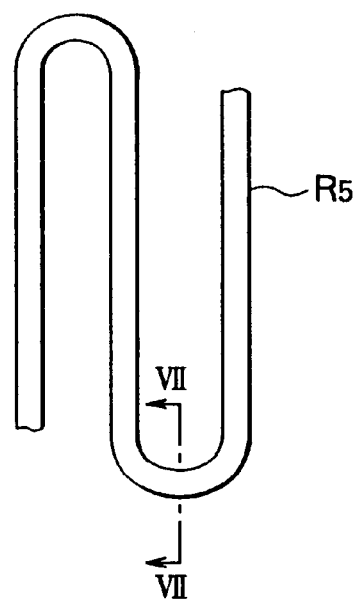
FIG. 6 is an enlarged fragmentary diagram illustrating the power supply resistor $R_5$ shown in FIG. 3.
Figure 7:
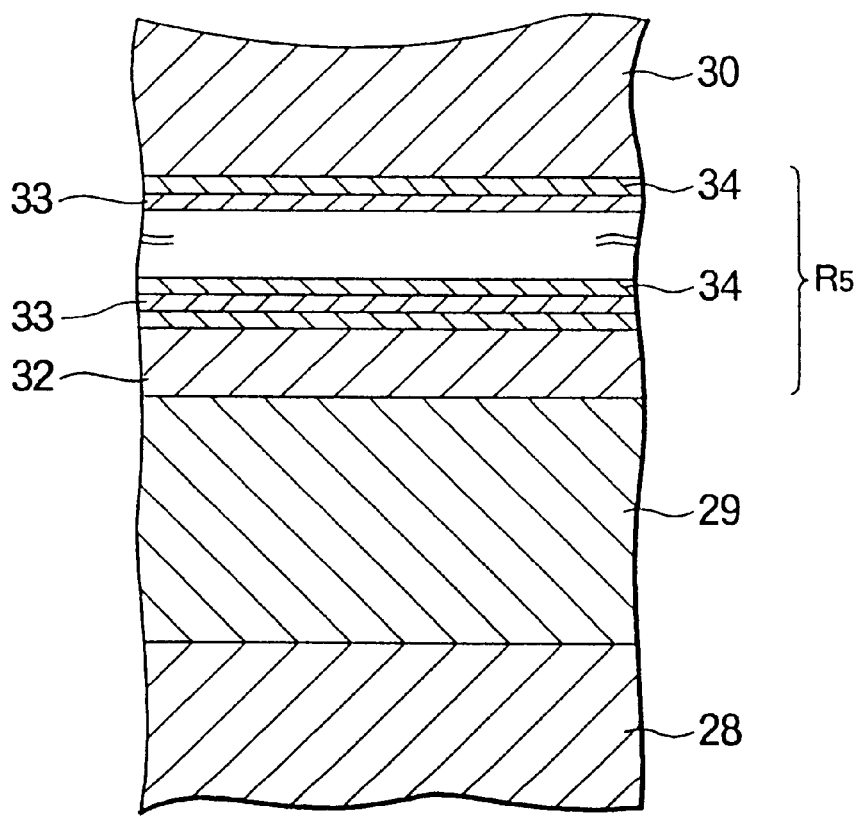
FIG. 7 is a cross-sectional view taken along line VII—VII of FIG. 6.

FIG. 6 is an enlarged fragmentary diagram illustrating the power supply resistor $R_5$ shown in FIG. 3. FIG. 7 is a cross-sectional view taken along line VII—VII across the power supply resistor $R_5$ shown in FIG. 6 wherein a protective film is formed on the power supply resistor $R_5$.

The power supply resistor $R_5$ is formed between a first protective film 29 formed on a silicon substrate 28 and a second protective film 30 formed at the top layer using silicon nitride or silicon dioxide. The power supply resistor $R_5$ is formed into a multilayer structure consisting of 20–25 layers obtained by alternately growing copper layers 33 having a thickness of 20–22 Å and cobalt layers 34 having a thickness of 20 Å on a cobalt buffer layer 32 having a thickness of 60 Å.

The output resistor $R_6$ is formed into the same structure as the power supply resistor $R_5$, which is also the same structure for each sensing resistor $R_1$–$R_4$. Therefore, the resistors $R_5$, $R_6$ of the filters 45, 46 can be produced during the same production process as that of producing each sensing resistor $R_1$–$R_4$.

In the above magnetic sensor, when a gear-shaped magnetic rotor 12 disposed near the magnetic sensor is rotated, the recessed portions 12a and the protruding portions 12b of the magnetic rotor 12 alternately approach and pass by the detector unit 23. This creates a corresponding change in the magnetic field of the permanent magnet 5 which is applied to the detector unit 23. The above change in the magnetic field causes a change in resistance of the sensing resistors $R_1$, $R_2$, $R_3$, and $R_4$ which are constituents of the bridge circuit in the detector unit. As a result, a change occurs in the voltage between node A and node B, shown in FIG. 3. This change in voltage is converted to an electric signal in the form of a pulse via a differential amplifier and a comparator in the processing circuit 27, and the resultant electric signal is output to the outside. The electric signal is transmitted to a computer unit (not shown) via a terminal of the connector 2 so as to detect the rotation angle of the magnetic rotor 12.

Figure 8:
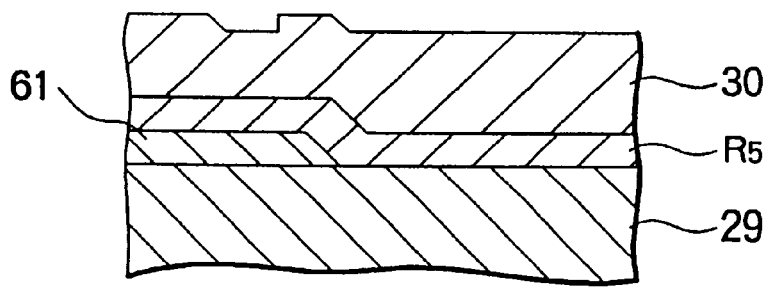
FIG. 8 is a cross-sectional view taken along line VIII—VIII of FIG. 4.

FIG. 8 is a cross-sectional view taken along line VIII—VIII of FIG. 4. As can be seen from this figure, the second interconnecting conductor 61 is formed between the power supply resistor $R_5$ and the first protective film 29 so that the power supply resistor $R_5$ is electrically connected to the processing circuit 27 via the second interconnecting conductor 61.

Figure 9:
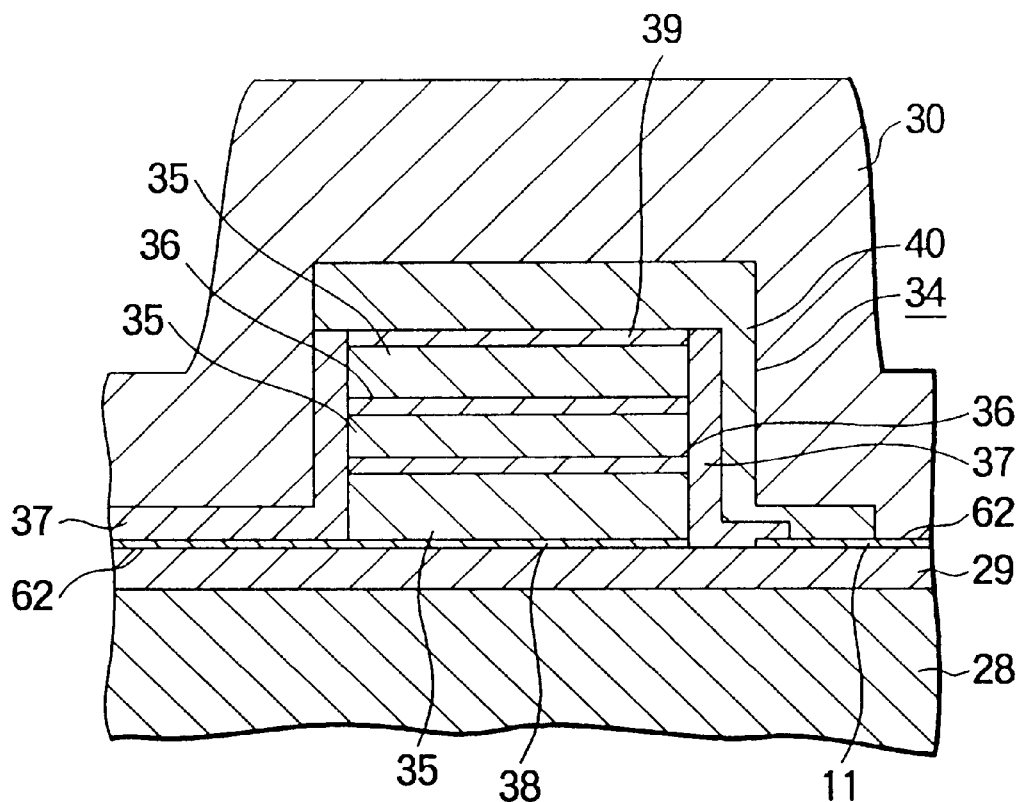
FIG. 9 is a cross-sectional view taken along line IX—IX across the surge protective capacitor $C_1$ shown in FIG. 4.

FIG. 9 is a cross-sectional view taken along line IX—IX across the surge protection capacitor $C_1$ shown in FIG. 4. As shown in FIG. 9, the surge protection capacitor $C_1$ includes a capacitor element 34 formed between the first protective film 29 and the second protective film 30. The capacitor element 34 includes: a lower electrode 38 connected to the third interconnecting conductor 62 which is in turn electrically connected to the processing circuit 27; dielectric layers (made of, for example, ceramic) 35 and conductive layers (made of, for example, aluminum) 36 which are alternately deposited into a multilayer structure on the lower electrode 38; and an upper electrode 39 formed on the top dielectric layer 35. The capacitor element 34 may include at least one or more dielectric layers. In the above structure, a third protective film 37 is formed on either side of the capacitor element 34, and the third interconnecting conductor 62 is electrically connected to the upper electrode 39 via a conductor 40. As the lower electrode 38 is formed into the same structure as the third interconnecting conductor 62, the lower electrode 38 can be produced during the same production process as that of producing the third interconnecting conductor 62.

Figure 10:
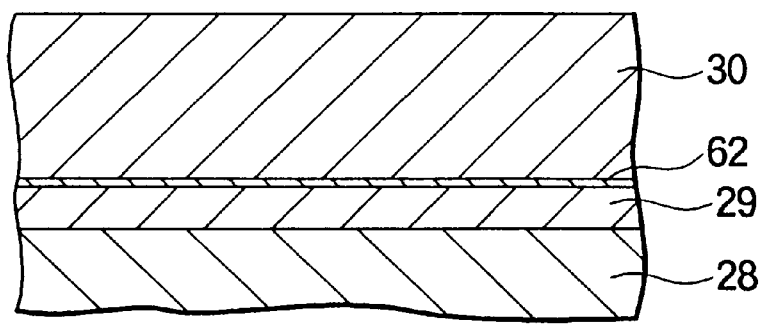
FIG. 10 is a cross-sectional view illustrating the structure in which the power supply capacitor $C_1$ has not been produced yet.

The procedure for producing the surge protection capacitor $C_1$ will be described below. Referring to FIG. 10, the first protective film 29, the third interconnecting conductor 62, and the second protective film 30 are successively formed on the silicon substrate 28. Then the protective film 30 on the third interconnecting conductor 62 is removed, and the third interconnecting conductor 62 is formed into a desired shape thereby forming the lower electrode 38. After that, dielectric layers 35 and conductive layers 36 are alternately deposited, and the third protective film 37 is then formed over the entire area. The third protective film 37 is partially removed so that the top conductive layer serving as the upper electrode 39 and also a part of the third interconnecting conductor 62 are exposed. The conductor 40 for electrically connecting the third interconnecting conductor 62 to the upper electrode 39 is formed. Finally, the second protective film 30 is formed.

The output capacitor $C_2$ is also fabricated in a similar structure using the same production process as the surge protection capacitor $C_1$ described above.

Second Embodiment

Figure 11:
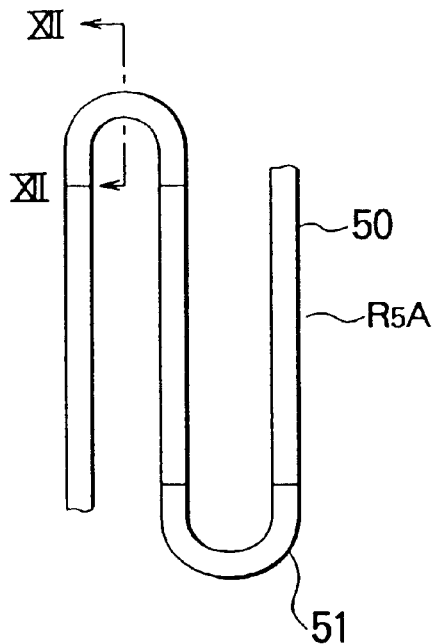
FIG. 11 is a fragmentary plan view illustrating a power supply resistor $R_5A$ according to a second embodiment of the invention.
Figure 12:
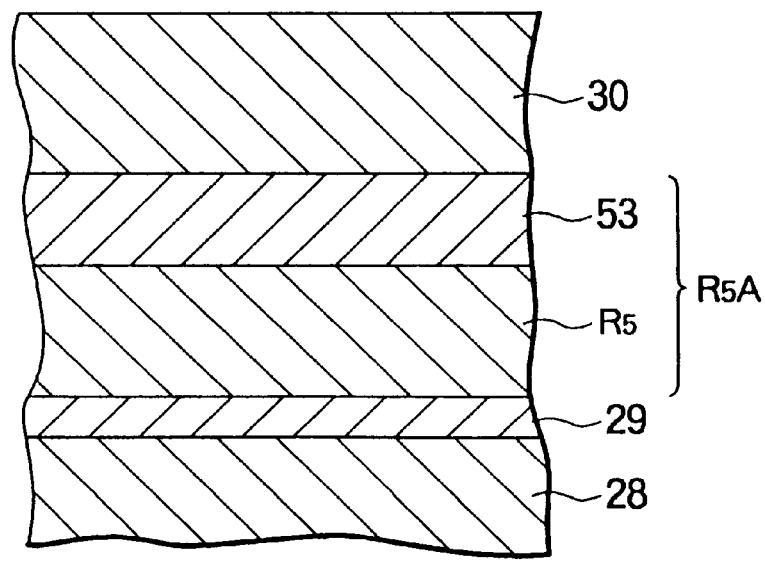
FIG. 12 is a cross-sectional view taken along line XII—XII across a curved portion of the power supply resistor shown in FIG. 11 wherein a second protective film is formed on the curved portion.

FIG. 11 is a fragmentary plan view illustrating a power supply resistor $R_5A$ according to a second embodiment of the invention. In this second embodiment, the power supply resistor $R_5A$ is formed into a zigzag shape consisting of straight-line portions 50 and curved portions 51. FIG. 12 is a cross-sectional view taken along line XII—XII across a curved portion 51 shown in FIG. 11 on which a second protective film 30 is formed. As shown in FIG. 12, the power supply resistor $R_5A$ is formed between a first protective film 29 and the second protective film 30. The curved portions 51 of the power supply resistor $R_5A$ are realized by forming an additional conductive layer 53 on the power supply resistor $R_5$ shown in FIG. 7.

In the magnetic sensor, when a surge current is applied to the power supply resistor $R_5A$, a current flows through the straight-line portions 50 in a rather uniform fashion with respect to the current density. In contrast, in the curved portions 51, the current tends to concentrate at the inner radius. This results from the fact that the length of the path along the inner radius is shorter than the length of the path along the outer radius, and therefore the resistance along the inner radius is smaller than the resistance along the outer radius. As a result, the surge resistance of the power supply resistor $R_5A$ is determined by the surge resistance of the path along the inner radius of the curved portions 51. In the magnetic sensor of this embodiment, the conductive layer 53 is also formed on the curved portions 51 of the power supply resistor $R_5$ so that the surge current can flow not only through the power supply resistor $R_5$, but also through the conductive layer 53 thereby reducing the magnitude of the surge current component flowing through the power supply resistor $R_5$, and thus improving the surge resistance of the curved portions 51.

Third Embodiment

Figure 13:
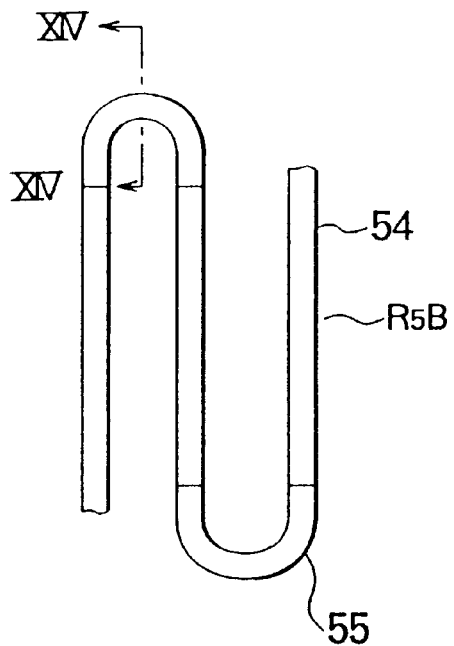
FIG. 13 is a fragmentary plan view illustrating a power supply resistor $R_5B$ according to a third embodiment of the invention.
Figure 14:
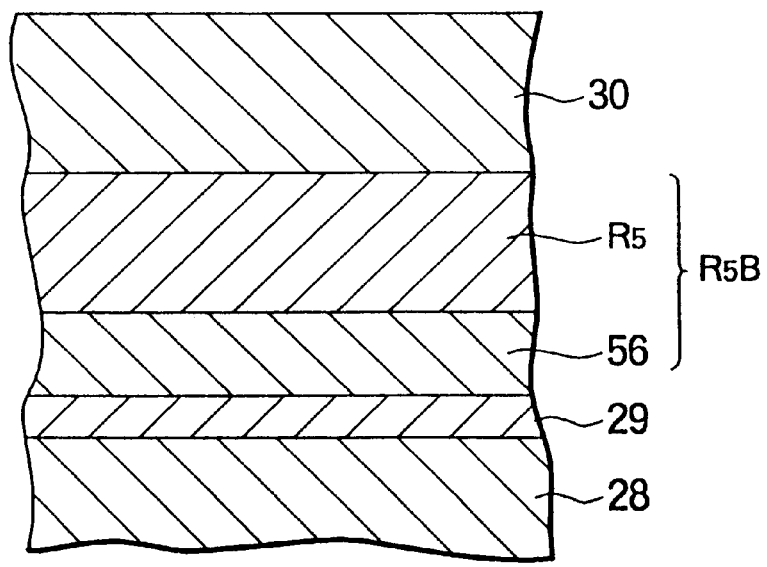
FIG. 14 is a cross-sectional view taken along line XIV—XIV across a curved portion of the power supply resistor shown in FIG. 13, wherein a second protective film is formed on the curved portion.

FIG. 13 is a plan view illustrating a power supply resistor $R_5B$ according to a third embodiment of the invention. In this third embodiment, the power supply resistor $R_5B$ is formed into a zigzag shape consisting of straight-line portions 54 and curved portions 55. FIG. 14 is a cross-sectional view taken along line XIV—XIV across a curved portion 55 shown in FIG. 13, on which a second protective film 30 is formed. As shown in FIG. 14, the power supply resistor $R_5B$ is formed between a first protective film 29 and the second protective film 30. The curved portions 51 of the power supply resistor $R_5B$ are realized by forming an additional conductive layer 56 under the power supply resistor $R_5$ shown in FIG. 7.

In this magnetic sensor of the third embodiment, since the conductive layer 56 is additionally formed under the curved portions 55 of the power supply resistor $R_5$, a surge current can flow not only through the power supply resistor $R_5$ but also through the conductive layer 56. As a result, the component of the surge current flowing through the power supply resistor $R_5$ is reduced and the surge resistance of the curved portions 55 is improved. The conductive layer 56 formed on the first protective film 29 has the same structure as that of the second interconnecting conductor 61, and therefore, the conductive layer 56 can be formed at the same time as the second interconnecting conductor 61 is formed. This means that no additional process for forming the conductive layer 56 is required.

Fourth Embodiment

Figure 15:
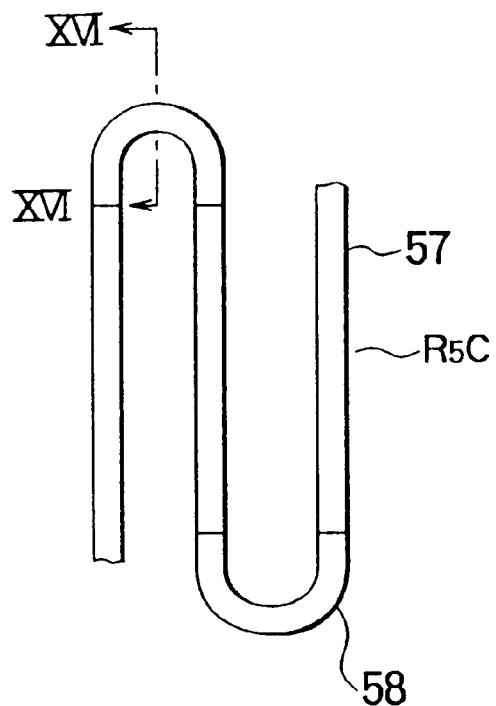
FIG. 15 is a fragmentary plan view illustrating a power supply resistor $R_5C$ according to a fourth embodiment of the invention.
Figure 16:
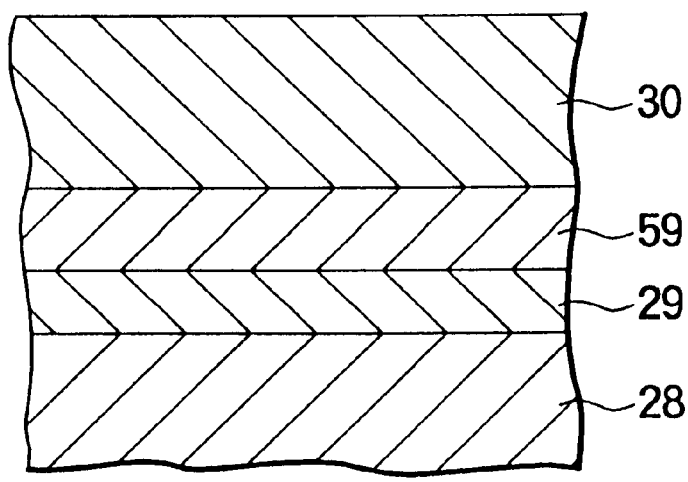
FIG. 16 is a cross-sectional view taken along line XVI—XVI across a curved portion of the power supply resistor shown in FIG. 15, wherein a second protective film is formed on the curved portion.
Figure 17:
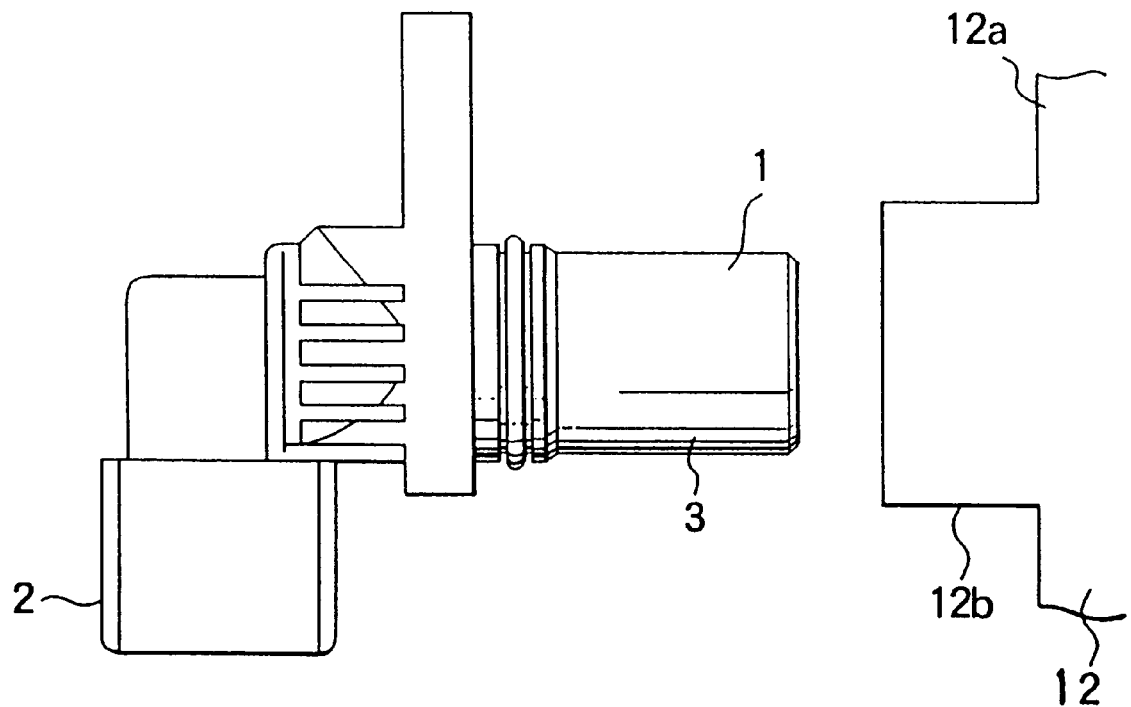
FIG. 17 is a side view illustrating a conventional magnetic sensor.
Figure 18:
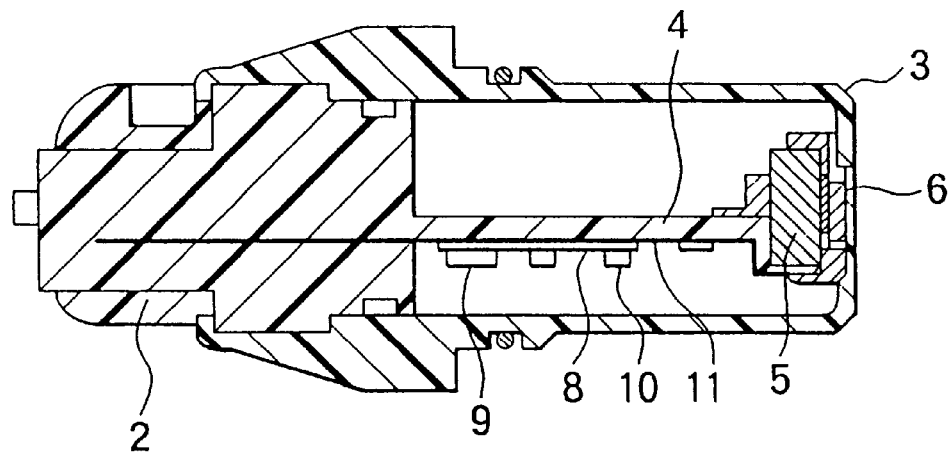
FIG. 18 is a sectional side view of the magnetic sensor shown in FIG. 17.
Figure 19:
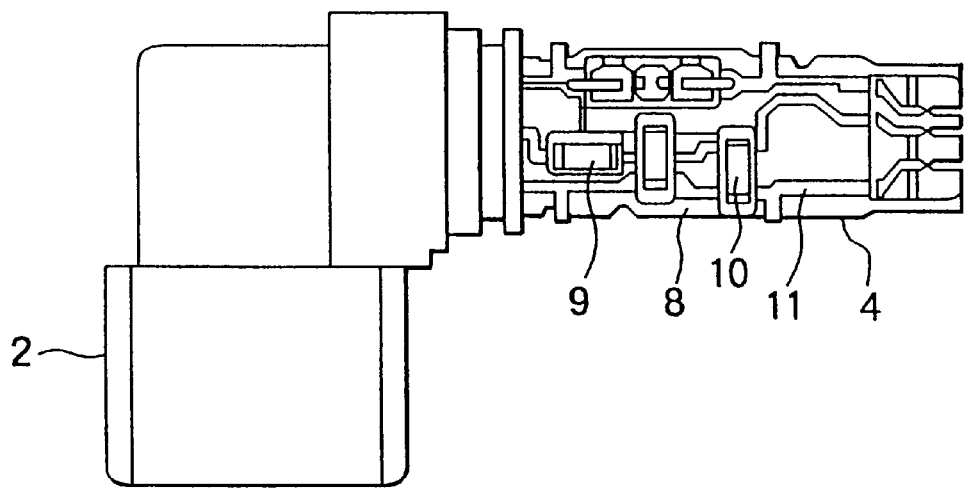
FIG. 19 is a bottom view illustrating the inner structure of the magnetic sensor shown in FIG. 18, wherein its case is removed so that the inner structure can be seen.

FIG. 15 is a fragmentary plan view illustrating a power supply resistor $R_5C$ according to a fourth embodiment of the invention. In this fourth embodiment, the power supply resistor $R_5C$ is formed into a zigzag shape consisting of straight-line portions 57 and curved portions 58. FIG. 16 is a cross-sectional view taken along line XVI—XVI across a curved portion 58 shown in FIG. 15, on which a second protective film 30 is formed. The curved portions 58 are realized by forming an additional conductive layer 59 between a first protective film 29 and the second protective film 30 wherein the conductive layer 59 is formed at the same time as a second interconnecting conductor 61 is formed.

In this magnetic sensor of the fourth embodiment, The conductive layer 59 of the curved portions 58 is formed of aluminum, as in the second interconnecting conductor 61. Thus, in the curved portions 58, a significant amount of surge current flows through the conductive layer 59. Since aluminum has a low resistance, the electric power dissipated in these portions becomes small, and therefore the surge resistance of the curved portions 51 is further improved compared to the third embodiment described above.

Although the power supply resistor has been described referring to the second, third, and fourth embodiments, the invention may also be applied to the output resistor in a similar manner. Furthermore, the magnetic field sensing element may also be realized using a magnetoresistive element instead of a giant magnetoresistance element.

In the present invention, as described above, the magnetic sensor includes the integrated circuit having the filter for protecting the processing circuit from noise. Thus, the filter can be realized without having to mount a capacitor and resistor on the substrate by soldering. Therefore, the production process is simplified and production efficiency is improved. This allows a reduction in production cost. Furthermore, it becomes possible to produce a magnetic sensor of a smaller size.

The resistor may be formed in such a manner as to have the same structure as that of the magnetic field sensing element of the magnetic detector unit. In this case, the resistor of the filter can be produced during the same production process as that of producing the magnetic sensing element. This allows simplification in the production process and thus the production cost can be reduced.

Furthermore, the part of the curved portions of the resistor in the zigzag shape may also be realized with a conductive layer formed so that the majority of a surge current flows through the conductive layer thereby improving the surge resistance of the curved portions.

When the curved portions of the resistor in the zigzag shape are formed with a conductive layer, the electric resistance of the curved portions becomes small and thus the surge resistance of the curved portions are improved.

Furthermore, the interconnecting conductor used to electrically connect the resistor to the processing circuit may be the same structure as that of the conductive layer of the curved portions of the resistor. In this case, the conductive layer may be fabricated at the same time the interconnecting conductor is fabricated, and therefore the production process can be simplified.

Furthermore, the interconnecting conductor used to electrically connect the capacitor to the processing circuit may be contained in the same structure as that of the electrode of the capacitor. In this case, the electrode may be fabricated at the same time the interconnecting conductor is fabricated, and therefore, the production process can be simplified.

What is claimed is:

1. A magnetic sensor comprising:

a magnet having an end face; and a detector unit having an integrated circuit, said integrated circuit having a magnetic detector unit, a processing circuit, and a filter all manufactured on one side of a substrate, said filter comprising one of a capacitor having an electrode and a resistor connected to a capacitor that has an electrode, wherein said magnetic detector unit has a magnetic field sensing element for outputting a signal in the form of a voltage change corresponding to a change in the magnetic field of said magnet, and wherein said processing circuit processes said signal output by said magnetic detector unit, and wherein said filter removes noise from said signal, and wherein said detector unit is disposed in close proximity to said end face of said magnet, and wherein said resistor is formed into a same structure as that of said magnetic field sensing element of said magnetic detector unit, and wherein said electrode of said capacitor is formed into a same structure as that of a first interconnecting conductor which connects the capacitor to the processing circuit.

2. A magnetic sensor as claimed in claim 1, wherein said resistor is formed into a zigzag shape having curved portions, and wherein a part of said curved portions are formed with a conductive layer for improving the surge resistance of said curved portions.

3. A magnetic sensor as claimed in claim 1, wherein said resistor is formed in a zigzag shape having curved portions, said curved portions formed with a conductive layer.

4. A magnetic sensor as claimed in claim 2, wherein a second interconnecting conductor connects said resistor to said processing circuit, said second interconnecting conductor formed into a same structure as that of said conductive layer.

5. A magnetic sensor as claimed in claim 1, wherein said resistor is a multilayer structure on a silicon substrate, said multilayer structure having a first protective film layer, a cobalt buffer layer disposed on top of said first protective film layer, a plurality of alternating layers of cobalt and copper disposed on top of said cobalt buffer layer, and a second protective film layer disposed on top of said plurality of alternating layers of cobalt and copper.

6. A magnetic sensor as claimed in claim 5, further comprising an interconnecting conductor layer disposed between a portion of said first protective film layer and said cobalt buffer layer.

7. A magnetic sensor as claimed in claim 1, wherein said capacitor is a multilayer structure on a silicon substrate, said multilayer structure having a first protective film layer, an interconnecting conductor disposed on top of said first protective film layer, a plurality of alternating layers of dielectric material and conductive material disposed on top of a portion of said first protective film layer and having an upper electrode, a second protective film layer disposed horizontally on top of a portion of said interconnecting conductor and a portion of said first protective film and disposed vertically along sides of said alternating layers of dielectric material and conductive material, a conductor layer disposed on top of a portion of said second protective film layer and on top of a portion of said interconnecting conductor and on top of said upper electrode, and a third protective film layer disposed on top of said conductor layer on top of a portion of said interconnecting conductor and on top of a portion of said second protective film layer.

8. A magnetic sensor as claimed in claim 2, wherein said resistor is a multilayer structure on a silicon substrate, and wherein said curved portions have a first protective film layer, a resistor material disposed on top of said first protective film layer, a conductive layer disposed on top of said resistor material, and a second protective film layer disposed on top of said conductive layer.

9. A magnetic sensor as claimed in claim 2, wherein said resistor is a multilayer structure on a silicon substrate, and wherein said curved portions have a first protective film layer, a conductive layer disposed on top of said first protective film layer, a resistor material disposed on top of said conductive layer, and a second protective film layer disposed on top of said resistor material.

10. A magnetic sensor as claimed in claim 2, wherein said resistor is a multilayer structure on a silicon substrate, and wherein said curved portions have a first protective film layer, a conductive layer disposed on top of said first protective film layer, and a second protective film layer disposed on top of said conductive layer.

11. A magnetic sensor as claimed in claim 1, wherein said magnetic field sensing element is a giant magnetoresistance element.

12. A magnetic sensor as claimed in claim 1, wherein said filter further comprises a second filter having at least one of a second capacitor having a second electrode and a second resistor connected to said a second capacitor, for further removing noise from said signal.

* * * * *